United States Patent

Gamble et al.

[11] Patent Number: 5,055,771
[45] Date of Patent: Oct. 8, 1991

[54] FAULTED CURRENT INDICATORS WITH IMPROVED SIGNAL TO NOISE RATIOS

[75] Inventors: John G. Gamble, Hull; Matthew G. Dillon, Hingham, both of Mass.

[73] Assignee: Sigma Instruments, Inc., Weymouth, Mass.

[21] Appl. No.: 396,595

[22] Filed: Aug. 21, 1989

[51] Int. Cl.[5] .................... G01R 33/02; G01R 19/00
[52] U.S. Cl. ................... 324/117 R; 324/133; 324/127
[58] Field of Search ....... 324/133, 127, 126, 117 R H, 324/102

[56] References Cited

U.S. PATENT DOCUMENTS

| | | | |
|---|---|---|---|
| 3,768,011 | 10/1973 | Swain | 324/117 R |
| 3,812,428 | 5/1974 | Trenkler | 324/127 |
| 3,816,816 | 6/1974 | Schweitzer, Jr. | 324/133 |
| 4,721,840 | 1/1988 | Fielding | 324/117 H |
| 4,939,449 | 7/1990 | Cattaneo et al. | 324/127 X |
| 4,947,108 | 8/1990 | Gudel | 324/127 X |

Primary Examiner—Kenneth A. Wieder
Assistant Examiner—Jack B. Harvey
Attorney, Agent, or Firm—Stanger, Michaelson, Spivak & Wallace

[57] ABSTRACT

A sensor in a faulted current indicator includes a coil and a magnetic arrangement passing through the coil and around a current-carrying conductor for coupling the coil to the conductor. The magnetic arrangement has given magnetic reluctance and forms a higher reluctance section, such as a gap, within the coil. Preferably the magnetic arrangement includes a U-shaped laminate and two core laminations joined to the U-shaped laminate by two gaps to allow for installation around the conductor. The ferromagnetic plate outside the coil shields the coil. The sensitivity of the sensor is increased by coating the inner surface of the U-shaped laminate and the core lamination surfaces contacting the U-shaped laminate with a high Ni content ferromagnetic material.

16 Claims, 2 Drawing Sheets

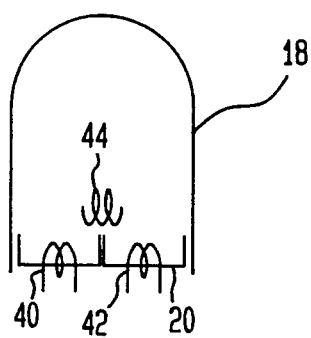
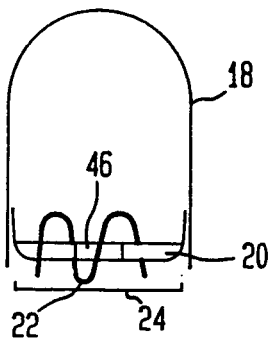
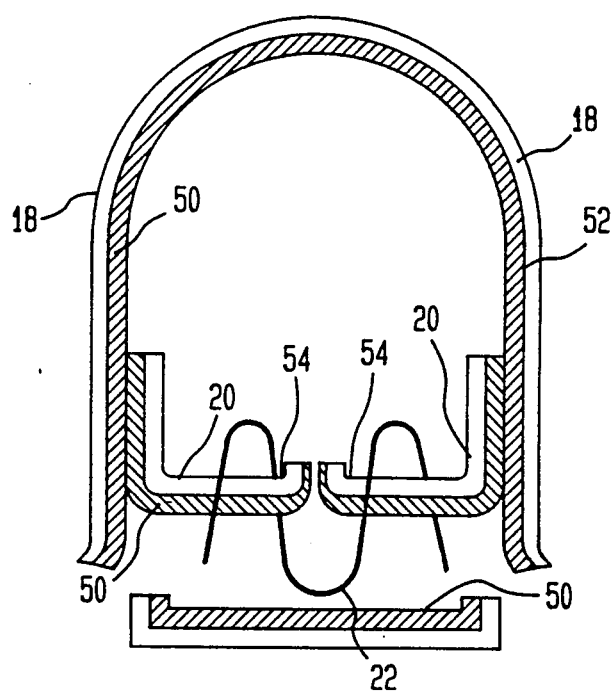
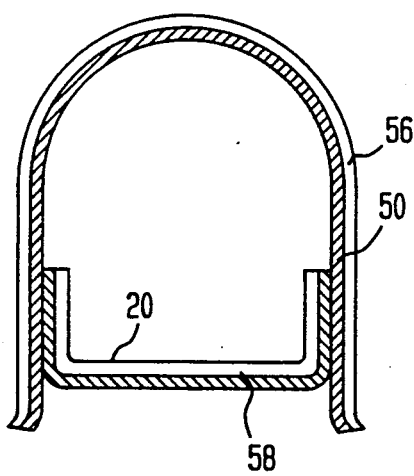
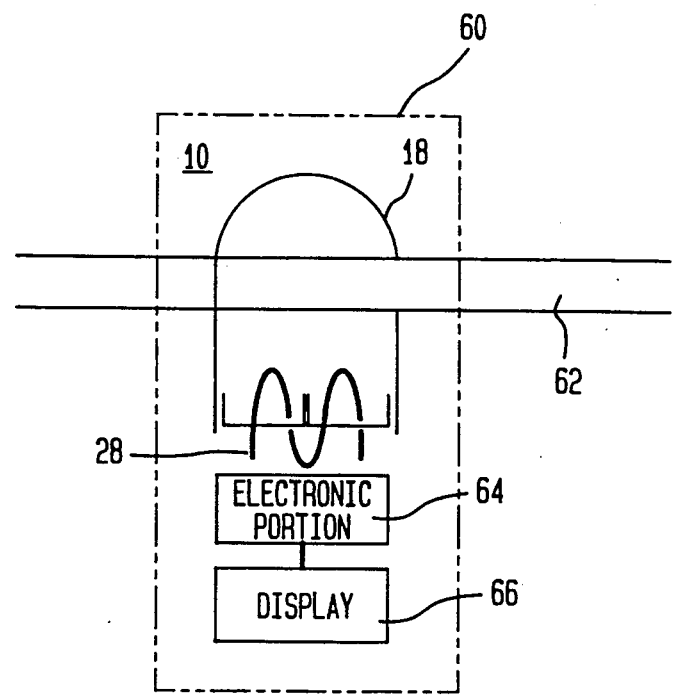

FAULTED CURRENT INDICATORS WITH IMPROVED SIGNAL TO NOISE RATIOS

BACKGROUND OF THE INVENTION

This invention relates to low noise faulted current indicators for power lines, and particularly to faulted current indicators capable of rejecting the effects of fluxes emanating from adjacent power lines. The invention also pertains to improvements in the sensitivity of fault indicator sensors.

Faulted current indicators (or FCI's or fault indicators) are placed at intervals along power lines or cables to decrease the time that it takes line crews to locate faults in utility distribution systems. In general, each FCI is a high current trip and low current reset indicating device that displays whether a fault has occurred between the indicator and a load. Such devices operate by responding to fluxes generated by currents in a line.

Typically, a sensor includes a magnetic core with surrounding a coil winding that serves as a transformer secondary to read out the current in the cable which functions as a transformer primary. Efficient coupling requires a minimum series reluctance so that the flux swing is maximized at 50 or 60 Hz. Further, the power transfer also depends upon the "copper window" and axial coupling area of the core about the power cable.

A sensor's output is a function of $N d\phi/dt$ and consequently the number of windings should be maximum for maximum signal voltage output. However, in three phase systems with but one sensor per indicator, the lines are not monitored in an "or" fashion, but rather, the individual lines indicate line fault and reset independent of the other phases. Thus, if a surge of current accompanying a short out fault in a given line trips an indicator and a fuse/circuit breaker then opens the line, an adjacent live phase with a sufficiently high current may falsely reset the open line indicator. Typically, the more sensitive the sensor is to the line to be sensed, the more sensitive that sensor is to external magnetic fields. This problem has heretofore limited the application of sensors heretofore in such environments.

OBJECTS AND SUMMARY OF THE INVENTION

An object of this invention is to overcome these deficiencies.

Another object of this invention is to make faulted current indicators less susceptible to the flux fields emanating from currents flowing in adjacent conductors.

Yet another object is to make sensor more sensitive while desensitizing them to noise from neighboring conductors.

According to a feature of the invention, these objects are attained in whole or in part by introducing a region of increased magnetic circuit reluctance into the ferromagnetic core in the center of the sensor coil winding.

According to another feature of the invention, the region of increased circuit reluctance within the coil is in the form of a central air gap.

According to another feature of the invention a sheet of high nickel content lines the core.

These and other features of the invention are pointed out in the claims. Other objects and advantages of the invention will become evident from the following detailed description when read in light of the accompanying drawings.

BRIEF DESCRIPTION OF THE DRAWINGS

FIG. 3 is a schematic diagram of another embodiment of the invention.

FIGS. 4 through 6 are schematic diagrams of other embodiments of the invention.

FIG. 7 is a schematic diagram of the sensor according to the invention as part of a fault indicator in a distribution system.

DETAILED DESCRIPTION OF PREFERRED EMBODIMENTS

Figure 1:
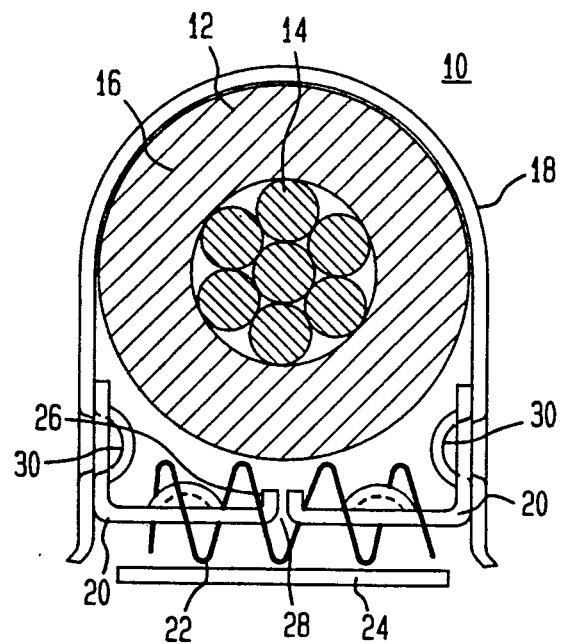
FIG. 1 is a partially schematic diagram illustrating a fault indicator sensor embodying features of the invention.

In FIG. 1, a sensor 10 embodying features of the invention, surrounds a power distribution cable 12 composed of interior conductors 14 and outer insulation 16. The sensor 10 includes a Ni-Fe "U" lamination 18, two L-shaped coil core laminations 20, a coil winding 22 surrounding the laminations 20, and a ferromagnetic shield 24. The laminations 20 terminate in two pole face enlargements 26 that confront each other.

A coat of paint (not shown) that may for example be 0.003" thick covers the laminations 18 and 20 to prevent corrosion of these ferromagnetic elements. The coated laminations 20 abut each other at the pole face enlargements 26 to form an isolation or control "air" gap 28 whose width is twice the thickness of the paint. Where the laminations 20 abut the lamination 18 they form "air" gaps 30 whose thickness is also double the thickness of the paint. The gaps 28 and 30 may be considered to be air gaps because paint has substantially the reluctance of air, namely unity.

The laminations 18 and 20 couple the flux arising from the current in the cable conductors 14 to the coil winding 22 that acts as a transformer secondary. A current surge higher than a predetermined value in the cable conductors 14 generates a voltage in the coil winding 22 sufficient to activate the trip mode of the faulted current indicator of which the sensor 10 is a part. The trip current then causes a circuit breaker in the distribution system to open the line. When power is restored and the current in cable conductors 14 reaches a predetermined reset value, the flux generated by the cable induces a voltage in the coil winding 22 sufficient to effectuate reset of the fault indicator. The gap 28 helps prevent fluxes produced by neighboring power phases from generating voltages in winding 22 sufficient reset the FCI. Such fluxes from neighboring power phases constitute noise to which the sensor is subject.

For after market installation and service, the sensor 10 has the capability of being clamped upon the cable and the magnetic circuit being closed effectively about the cable after the cable circuit has been completed. This is accomplished by the circuit being opened and reclosed after cable installation at the two air gaps 30 which form the two areas of connection.

Introducing the air gap 28 (a region of increased magnetic circuit reluctance) in the center of the ferromagnetic core (laminations 18 and 20) and in the center of the sensor coil winding 22, attenuates the signal level but slightly while offering a significantly large immunity against the influence of adjacent magnetic field "noise". It improves the signal to noise ratio markedly and allows an increase in the sensor sensitivity to register low level signal currents, upon the restoration of power to an area. Such sensitivity is required in rural areas for example where power is delivered at high voltage and consequently at low current to minimize the I$^2$R losses. If there is a detected fault, and the electronics of the FCI captures the energy and delivers it appropriately to the FCI's electromagnetic indicator, the indicator shifts to indicate the event. Upon restoration of service, the sensor 10 captures enough energy to fire the reset mode of the indicator to thereby represent the true state of the cable.

The advantages of the gap 28 will be evident from the following. The magnetic field (MMF) drops effectively linearly with the distance from the center of a conductor. (While this can be shown not to be rigorously true, it is effectively true for the distances considered here). Since the decrease in amplitude from a neighboring conductor is effectively linear, the field intensity which strikes the coil core laminations 20 perpendicularly, quite nearly equally divides at the central gap 28 to thread the right and left halves of the windings in equal but opposite intensities of the changing magnetic field. This phenomenon results from the interposition of the gap 28 such that a line of flux impinging upon the right half of the split core sees but one gap 30 to complete its path if it goes to the right, and two reluctances 28 and 30 in series if it goes to the left. Similarly, if a flux line of nearly equal intensity strikes the left half of the circuit gap 28, it sees less reluctance by staying left than jumping the central gap 28 and also the gap 30 on the right as the core element interfaces the "U" lamination.

In effect then the combination of the split core magnetic circuit and the common "handedness" of the windings produce an additive voltage in the output of the sense secondary for the phase being monitored, while there is a subtractive double voltage in the secondary in response to "noise" from an adjacent power cable. This is a "magnetic" common mode rejection which produces a very large capability to sense intended signal only.

Figure 2:
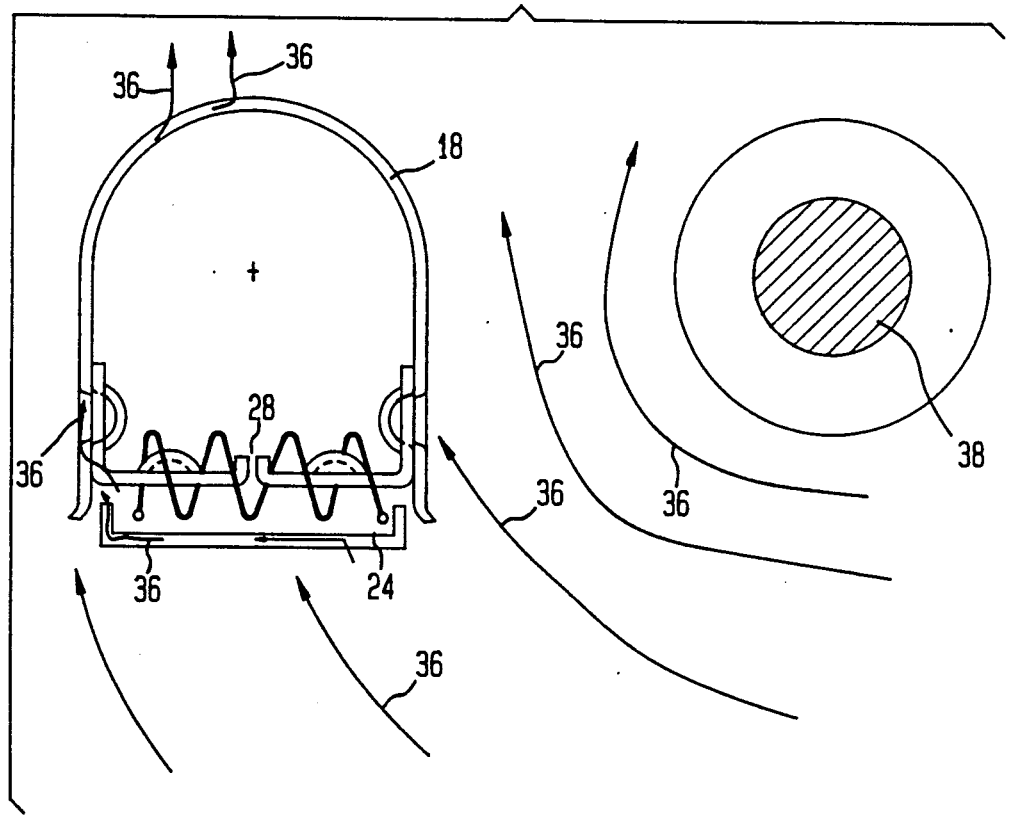
FIG. 2 is a schematic diagram showing the flow of flux generated by an adjacent cable in the sensor according to the invention.

The ferromagnetic shield 24 forming a screen outside of the coil 22 diminishes the intensity of the impinging noise magnetic field. The flux lines 36 produced by an adjacent conductor 38 appears in FIG. 2.

The shield 24 is in the form of a hi mu plate of for example, 80% Ni-Fe. In all attitudes of sensor to adjacent field influence there is a shorting out of external fields which induce these flux lines to by-pass the sense coils. This is quite effective in extending the range of adjacent signal intensity which will be excluded, and the circumferential scope of afforded exclusion immunity. Not only is there a convenient conduit of low reluctance offered as a by-pass for external energy sources, but as the by-passed field intensity increases the flux density within the shield, this shield field has an orientation which resists rotation to permit leakage to the coil core elements. It thus becomes more effective due to the polarization. Once saturated, the ferromagnetic material has a reduced permeability and flux lines from other sources cannot cause a field rotation unless the conflicting H field dominates the initial H field intensity. The combination is more effective than either element alone.

The invention furnishes a structure that directs the magnetic field from an adjacent magnetic field source so as to divide it essentially equally within a winding or pairs of windings that produce generated voltages which are of opposing polarities resulting in a nulling out of external energy fields while providing an efficient magnetic path for the monitoring of the intended signal cable. The invention offers a magnetic common mode rejection circuit which generates voltages which add in the signal mode and subtract in the noise mode such that an improvement is to be had in the signal to noise ratio. The invention further provides a hi mu screen in coaction with the common mode rejection circuit to act as a buffer to the negating magnetic circuit of the split sensor core.

In another embodiment of the invention, the winding about the split core is in the form of a number of discrete coil windings 40, 42, and 44. This is shown schematically in FIG. 3.

According to another embodiment, shown in FIG. 4, the physical gap in the core, which presents a discriminating reluctance circuit, is in the form of a distributed "air gap" such as in powdered metal soft ferrite 46 or equivalent. In each case the direction of the flux "flow" is reluctively decided within the turns of a symmetrical secondary winding(s). The ferrite core may be used with the one winding 22 or multiple windings 40 to 44.

Another embodiment of the invention improves the sensitivity of the sensor 10 and is shown in FIG. 5. Here, a single high Ni sheet 50, for example composed of 80% Ni and 20% Fe and 0.025" thick, is laminated upon the interior surface of the "U" lamination 18 and the "outside" surface of lamination 20 of the split coil core. The covered laminations form structures 52 and 54. The paint is on the outside of the structures 52 and 54. The high Ni alloy sheets of the structures 52 and 54 interface each other rather than the 50—50 alloy of the laminates 18 and 20.

This hybrid magnetic circuit marries the B-H curves in proportion to their cross sectional areas and relative air gaps. Thus, not only is the sensitivity at low MMF's greatly improved, but the lower % Ni alloy sustains permeability to extend the range to include the high saturation density of the higher iron content alloy. The matching of these materials makes the combined B-H curve follow a smooth continuum with respect to monitoring input energy over an extended range. The arrangement improves the dynamic range of the sensor 10 by making it more sensitive at low current levels such as ½ ampere.

According to an embodiment of the invention the sheet 50 is laminated to a laminates 56 and 58 which do not include a gap 28 as shown in FIG. 6.

FIG. 7 shows the sensor 10 as part of a faulted current indicator 60 in a line 62 of a distribution system. The indicator includes an electronic portion 64 and an electromagnetic display 66.

According to an embodiment of the invention the shield 24 is made of material having high saturation flux density at high magnetic stress fields. The reason is as follows. The common mode rejection magnetic circuit alone discriminates against an external source of MMF. However, the H field is linear in dropping off in intensity as a probe is moved in a straight line away from a conductor. That is to say that the flux intensity can be very high in the sensor core elements without triggering "reset" even approaching saturation of the Ni Fe core. Nevertheless, the individual, essentially equal and opposite voltages are present and yield a NET VOLTAGE which expresses the differential of the imperfect nulling. The field intensity at such a point in time must be equal (or nearly equal) in any adjacent ferromagnetic material placed in proximity to the coil core elements.

Further it should be noted that the preferred magnetic path for any flux line will be that course which offers the lowest reluctance in view of the various elements which influence this parameter, e.g., material permeability, level of flux density in the material, series air gaps in total magnetic path about the conductor (source cable), angle of MMF across the reluctance, etc. etc.

According to another embodiment the shield is composed of a piece of annealed Fe which was basically flat across the coil, but turned up at the ends would reduce the magnetic path at the ends of the shield. Thus it makes the preferred circuit option more decisive and the capacity for carrying flux without reducing the permeability at the higher H fields would be increased.

As the amplitude of the noise source increases from zero, the screen does not magnetically polarize until the H field reaches the level of minimum MMF to cause a gain by virtue of the permeability of the iron shield. At this point, a least polarization starts to take place. Shortly thereafter the field which has been the B field through the split core will be sheared by the diverted external circuit since the initial B field cannot cross the axis of the shield after the shield is polarized at a sufficient strength. As the intensity increases further, the dominant circuit through the sensor will become the double paths through the split core laminations, but the MMF to accomplish this will be very much higher than without the shield.

Introducing a series air gap in the sensor circuit decreases the sensitivity of the sensor to the cable which it monitors; however, the immunity it affords by providing the division of the impinging magnetic field, is very much greater than the loss in signal. Therein lies the improvement in signal to noise ratio. The loss in signal can be compensated by increasing the amount of flux seen by the coil at 60 hz, and the turns ratio as well as the copper "window" of the sensor coil.

While embodiments of the invention have been described in detail, it will be evident to those skilled in the art that the invention may be embodied otherwise.

What is claimed is:

1. A sensor for sensing current in a conductor, comprising:
   sensing means for producing an output corresponding to current flowing through the conductor, said sensing means including a coil;
   magnetic means passing through said coil for coupling said coil to said conductor said magnetic means forming a substantially closed loop surrounding the conductor so that the conductor passes through the loop of said magnetic means;
   said magnetic means including noise reduction means for reducing the sensitivity of said magnetic means to flux fields emanating from outside the loop of said magnetic means and for diverting flux fields emanating from outside the loop of the magnetic means in opposite directions along the loop;
   said magnetic means having given magnetic reluctance and said noise reduction means forming a section within said coil with a higher reluctance than the given reluctance;
   said section of said noise reduction means being substantially uniform and free of magnetically distorting materials, and said sensing means being substantially responsive to fields in said magnetic means and free of current inputs from other sources.

2. A sensor as in claim 1, wherein said magnetic means includes a lamination for surrounding the conductor.

3. A sensor as in claim 1, wherein said higher reluctance section includes a magnetic gap.

4. A sensor as in claim 1, wherein said higher reluctance section is a gap having a reluctance substantially equal to an air gap.

5. A sensor as in claim 1, wherein said magnetic means includes a U-shaped portion outside the coil and two extension portions extending toward each other into said coil for forming the higher reluctance section.

6. A sensor as in claim 5, wherein said U-shaped portion and said extension portions form magnetic gaps between the U-shaped portions and said extension portions.

7. A sensor as in claim 1, wherein said magnetic means includes a shunt portion outside of said coil for shielding said coil.

8. A sensor as in claim 6, wherein said extension portions form a magnetic gap between the extension portions so as to establish the section with the higher reluctance.

9. A sensor as in claim 1, wherein the coil has a length and is wound in one direction throughout its length, and the section of higher reluctance is in the center of the length of the coil.

10. A sensor as in claim 1, wherein the coil includes a plurality of windings.

11. A sensor as in claim 1, wherein the section of higher reluctance includes a distributed air gap of powdered metal ferrite.

12. A sensor as in claim 1, wherein said magnetic means includes a U-shaped laminate of a ferromagnetic material and a cover lamina of ferromagnetic material having a higher nickel content than the laminate.

13. A sensor as in claim 1, wherein said magnetic means includes a U-shaped laminate outside the coil and two extension portions extending toward each other into said coil for forming the higher reluctance section, said U-shaped laminate and said extension portions being of a ferromagnetic material and each having a face covered with a lamina of ferromagnetic material with a higher nickel content than the laminate and the extension portions, said lamina of said U-shaped laminate contacting said lamina of said extension portions.

14. A sensor as in claim 1, wherein
   said noise reduction means in said magnetic means includes means for dividing magnetic flux components perpendicular to said coil into separate paths through said magnetic means so as to cancel currents induced by the flux components said coil.

15. A sensor for sensing current in a conductor, comprising:
   a coil;
   magnetic means passing through said coil for coupling said coil to said conductor;
   said magnetic means including lamination means having a first laminar portion of a first ferromagnetic material and a second laminar portion of a second ferromagnetic material on the surface of the first portion and having a nickel content higher than the first ferromagnetic material;
   said magnetic means being divided into two laminar sections;

said laminar sections of said magnetic means extending toward each other within said coil to form a gap having a reluctance higher than the remaining portion of said magnetic means, said laminar sections terminating at the gap in two oppositely facing projections projecting transverse to the laminar sections.

16. A fault indicator comprising:

sensing means for producing an output corresponding to current flowing through the conductor, said sensing means including a coil;

magnetic means passing through said coil for coupling said coil to said conductor said magnetic means forming a substantially closed loop surrounding the conductor so that the conductor passes through the loop of said magnetic means;

said magnetic means including noise reduction means for reducing the sensitivity of said magnetic means to flux fields emanating from outside the loop of said magnetic means and for diverting flux fields emanating from outside the loop of the magnetic means in opposite directions along the loop;

said magnetic means having given magnetic reluctance and said noise reduction means forming a section within said coil with a higher reluctance than the given reluctance;

said section of said noise reduction means being substantially uniform and free of magnetically distorting materials, and said sensing means being substantially responsive to fields in said magnetic means and free of current inputs from other sources; and a display responsive to said sensing means.

* * * * *